(12) United States Patent
Gee et al.

(10) Patent No.: US 7,576,370 B2
(45) Date of Patent: Aug. 18, 2009

(54) LOW OPERATING VOLTAGE ELECTRO-STATIC DISCHARGE DEVICE AND METHOD

(75) Inventors: Harry Yue Gee, Sunnyvale, CA (US); Umesh Sharma, Santa Clara, CA (US)

(73) Assignee: California Micro Devices, Milpitas, CA (US)

( * ) Notice: Subject to any disclaimer, the term of this patent is extended or adjusted under 35 U.S.C. 154(b) by 294 days.

(21) Appl. No.: 11/738,152

(22) Filed: Apr. 20, 2007

(65) Prior Publication Data

US 2008/0259518 A1    Oct. 23, 2008

(51) Int. Cl.
*H01L 29/74* (2006.01)
*H01L 31/111* (2006.01)
(52) U.S. Cl. .................. 257/173; 257/199; 257/603; 257/E29.335
(58) Field of Classification Search ................ 257/106, 257/173, 175, 199, 481, 551, 603, E29.335
See application file for complete search history.

(56) References Cited

U.S. PATENT DOCUMENTS

| 5,880,511 | A | 3/1999 | Yu et al. |
| 6,891,207 | B2* | 5/2005 | Pequignot et al. ............ 257/173 |
| 2006/0028879 | A1 | 2/2006 | Nakakuma et al. |
| 2007/0038659 | A1 | 2/2007 | Datar et al. |

* cited by examiner

*Primary Examiner*—Hoai v Pham
(74) *Attorney, Agent, or Firm*—Pillsbury Winthrop Shaw Pittman LLP

(57) ABSTRACT

The present invention describes ESD apparatus, methods of forming the same, and methods of providing ESD protection. In certain aspects, the invention achieves the desired turn-on voltage and maintains low leakage in the ESD apparatus, and the methods of providing ESD protection. In one aspect, a zener diode that has a positive trigger voltage is used to quickly turn-on a transistor. In another aspect, different zener diodes that have positive and negative trigger voltages, respectively, are used to quickly turn on a transistor. In still another aspect, a linearly graded P-region is used to implement the ESD device of the present invention.

17 Claims, 8 Drawing Sheets

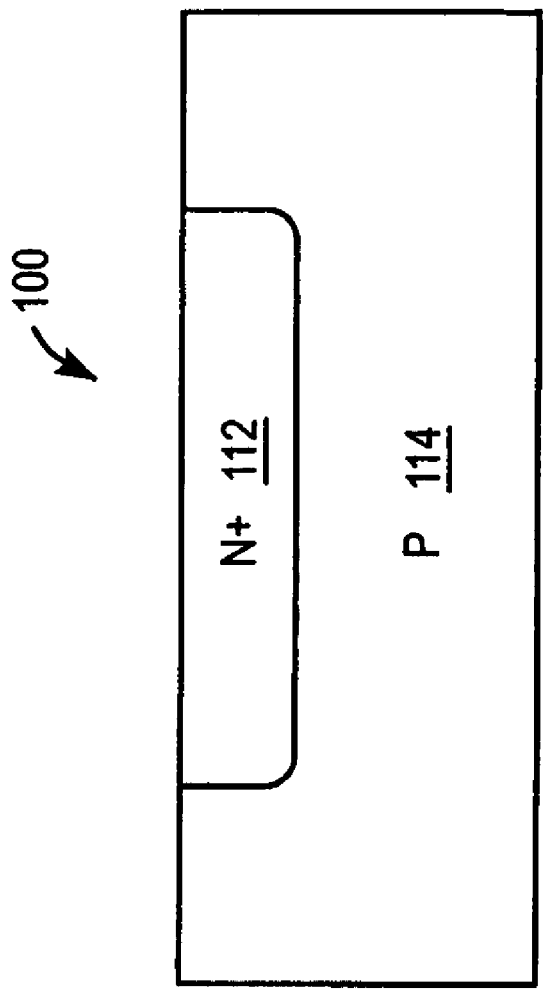
FIG. 1(a)2
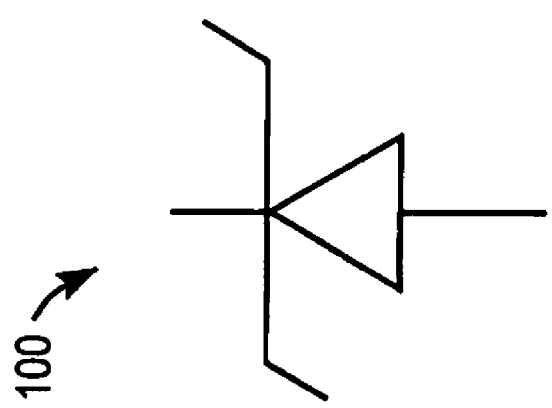
FIG. 1(a)1

LOW OPERATING VOLTAGE ELECTRO-STATIC DISCHARGE DEVICE AND METHOD

FIELD OF THE INVENTION

The present invention relates to device structures and method of making and operating the device structures to protect low voltage integrated circuits from ESD damage.

BACKGROUND OF THE INVENTION

Electro-Static Discharge (ESD) is a problem for integrated circuits. Accordingly, integrated circuits are protected against ESD events by special devices. A desired ESD device structure must be able to turn on when the Vcc is exceeded. Once the ESD device is activated, the ESD event discharges through the ESD device rather than the integrated circuit. If the ESD device does not turn on at or does not turn on quickly enough, an ESD event can damage the integrated circuit. Additional requirements for the ESD device are low leakage current and low input capacitance during normal operation.

The simplest ESD protection device is a p-n junction Zener diode 100, such as illustrated in FIG. 1(a)(1-2). This p-n Zener diode 100, shown in FIG. 1(a)(1), can be manufactured as shown in FIG. 1(a)2 by implanting an N-doped area 112 into a P+ doped substrate 114. This zener diode 100 when reverse biased operates in the avalanche breakdown regime and conducts current. To achieve 5 volts or less breakdown, requires heavily doped N and P regions. A N+/P+ doped zener diode is extremely leaky because of electron tunneling current across the P+/N+ junction. Another drawback of this N+/P+ zener diode is the increase in junction capacitance.

Another known ESD device is a vertical N+/P/N+ structure 120 shown in FIG. 1(b), and operates as a punch-thru device, having N+ region 122, P region 124, and N+ region 126. Initial Punch-thru voltage is determined by the doping and width of the P-region 124. It is difficult to maintain tight control for low punch-thru Voltage and Clamp Voltage because this structure 120 requires tight control of the P region widths.

Another ESD device is a vertical N+/P+/P−/N+ structure 130 as shown in FIG. 1(c), which has an N+ region 132, a P+ region 134, a P− region 136 and an N+ region 138, where the P+ region 134 encompasses the N+ region 132. Drawbacks for this device include the high reverse breakdown voltage because of the lightly doped P− region.

It is difficult to develop an ESD structure that protects integrated circuits that operate at low Vcc (<5 Volts), has low leakage (<100 nAmp), has low capacitance and has low reverse breakdown voltage.

SUMMARY OF THE INVENTION

The present invention describes ESD apparatus, methods of forming the same, and methods of providing ESD protection.

In certain aspects, the invention achieves the desired turn-on voltage and maintains low leakage in the ESD apparatus, and the methods of providing ESD protection.

In one aspect, a zener diode that has a positive trigger voltage is used to quickly turn-on a transistor.

In another aspect, different zener diodes that have positive and negative trigger voltages, respectively, are used to quickly turn on a transistor.

In still another aspect, a linearly graded P-region is used to implement the ESD device of the present invention.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 1(a)-1(c) illustrate conventional ESD devices;

DETAILED DESCRIPTION OF THE PREFERRED EMBODIMENTS

Figure 1B:
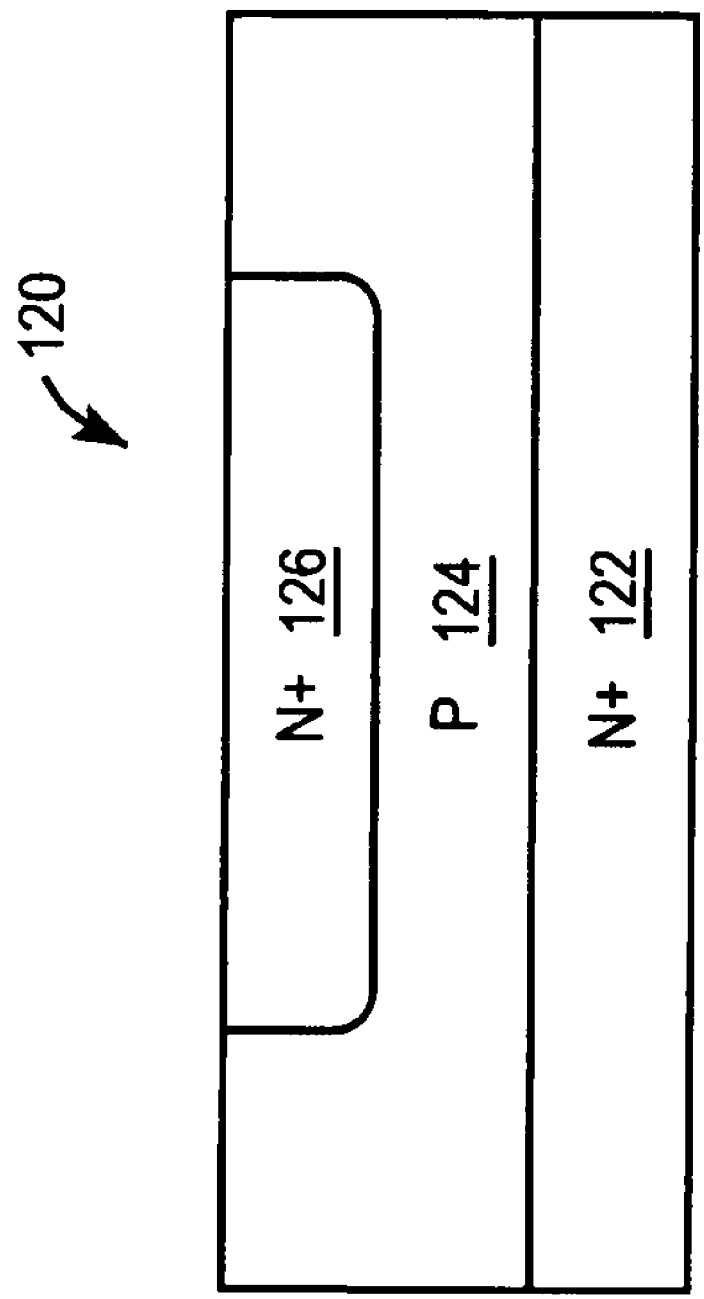
Figure 1C:
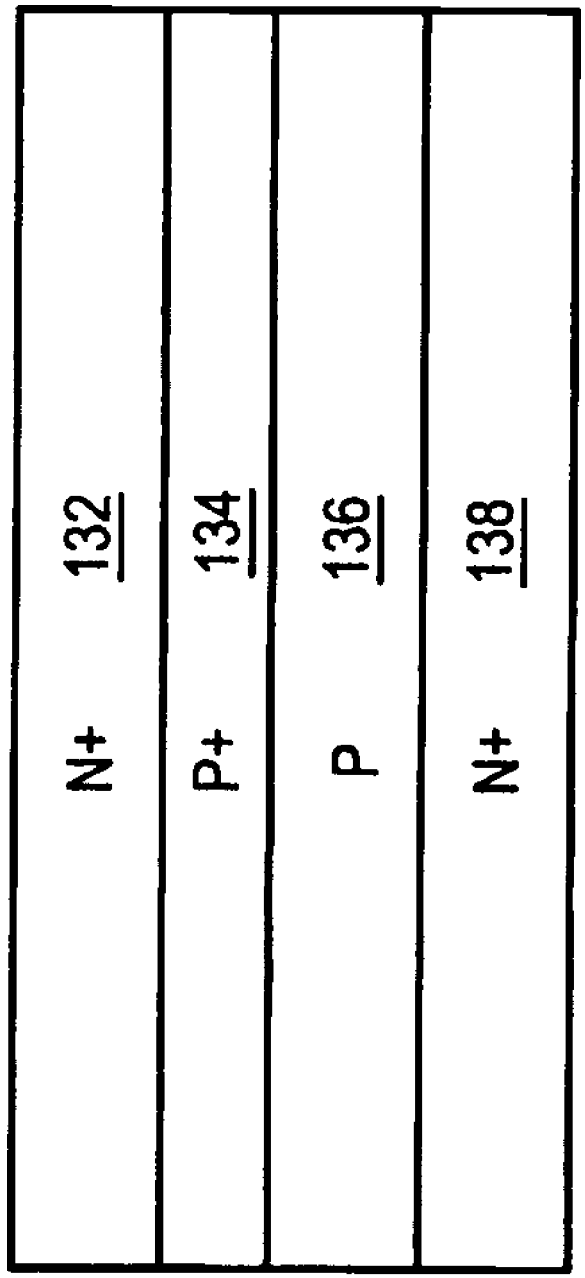
Figure 2A:
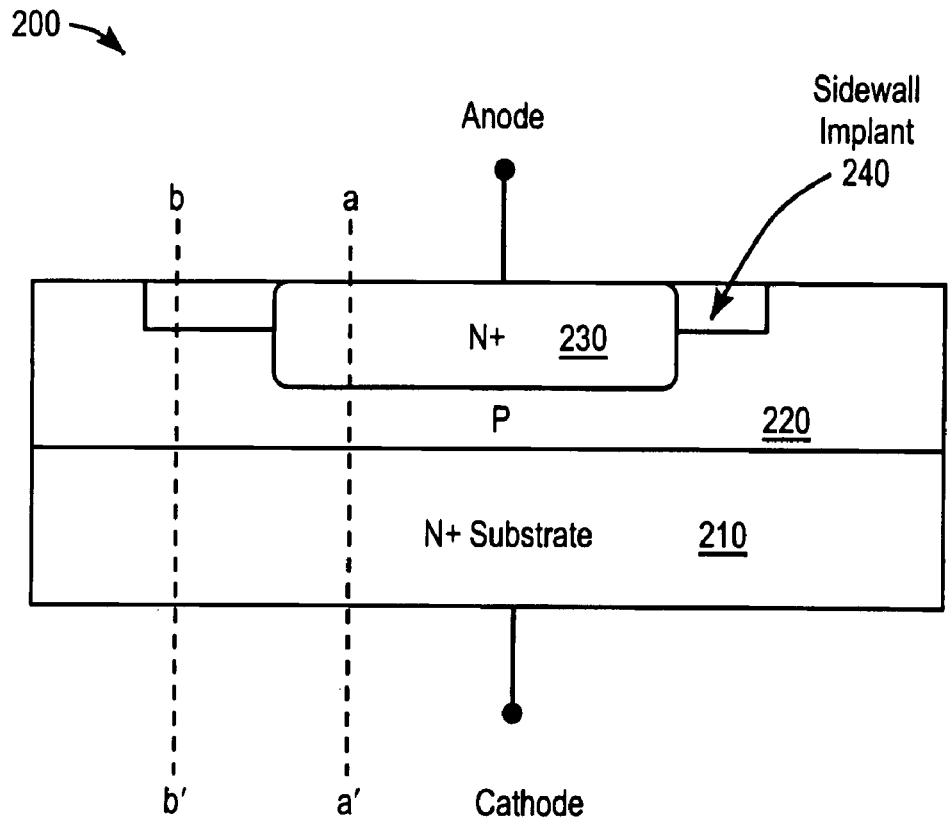
FIGS. 2(a)-2(c) illustrate one embodiment of an ESD device according to the present invention.
Figure 2B:
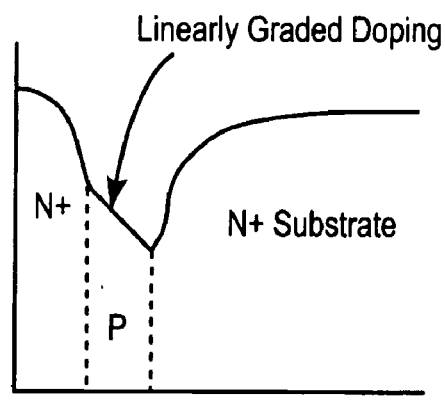
Figure 2C:
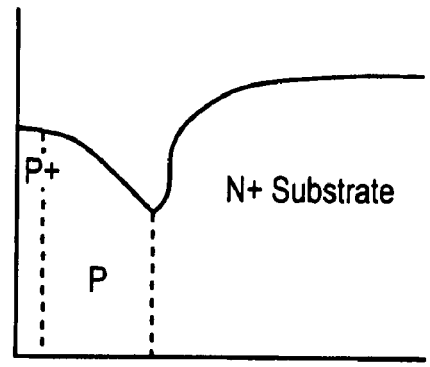
Figure 3A:
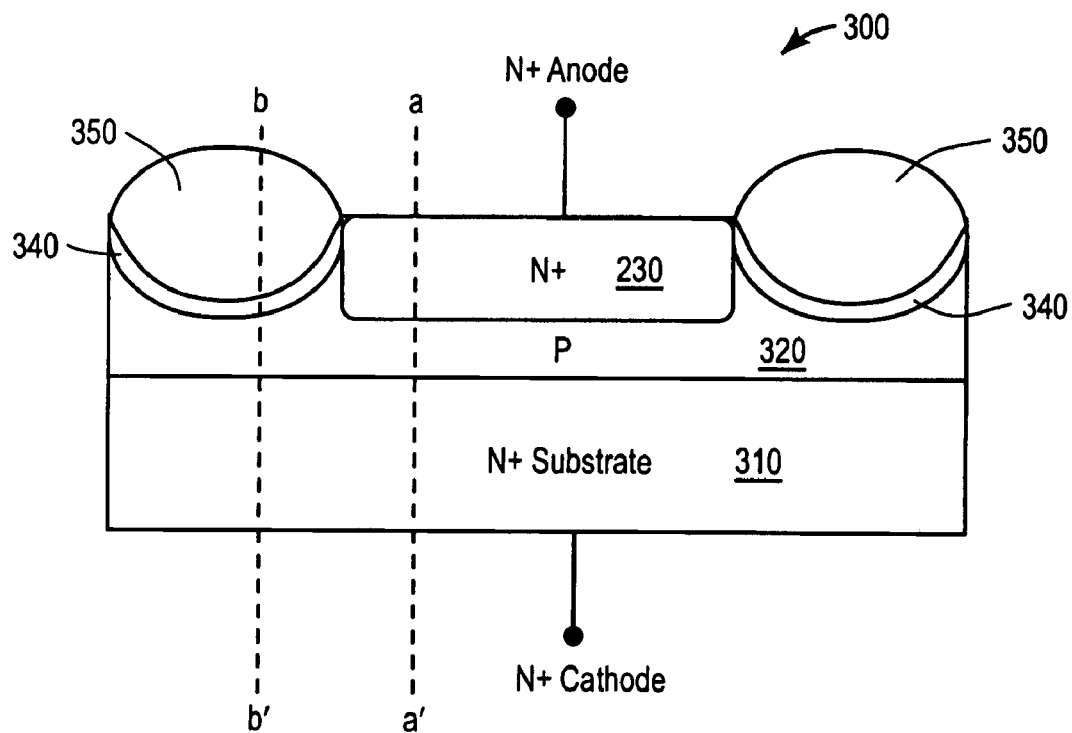
FIGS. 3(a)-3(c) illustrate another embodiment of an ESD device according to the present invention.
Figures 3B, 3C:
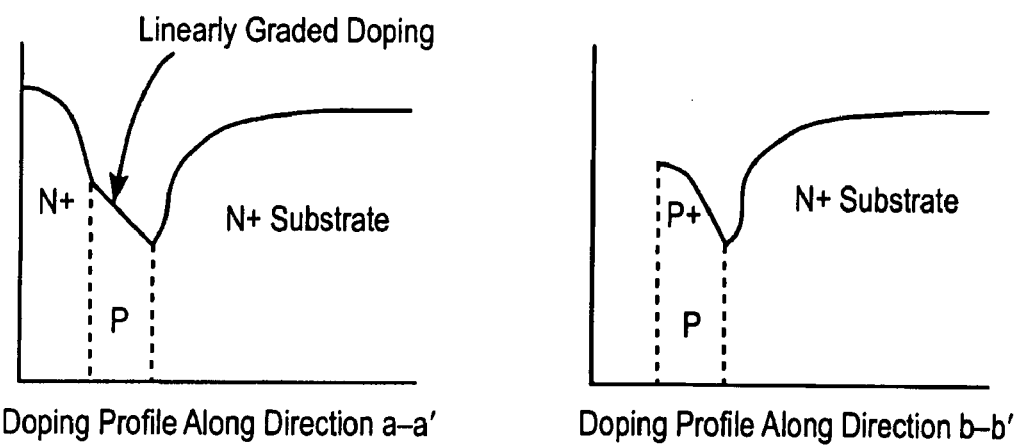

FIGS. 2(a)-2(c) illustrate one embodiment of an ESD device 200 according to the present invention. FIGS. 3(a)-3(c) illustrate another embodiment of an ESD device 300 according to the present invention.

FIG. 2(a) illustrates ESD protection device 200 that has an N+ cathode substrate 210, a P region 220, an N+ anode region 230, and a P+ sidewall implant 240. The doping profile along lines a-a is illustrated in FIG. 2(b) and the doping profile along lines b-b is illustrated in FIG. 2(c).

FIG. 3(a) illustrates ESD protection device 300 that has an N+ cathode substrate 310, a P region 320, an N+ anode region 330, a P+ field implant 340, over which is disposed a field oxide 350. The doping profile along lines a-a is illustrated in FIG. 3(b) and the doping profile along lines b-b is illustrated in FIG. 3(c), and as is apparent, have very similar profiles to that of FIGS. 2(b) and 2(c) respectively.

With respect to each of FIGS. 2(b), 2(c), 3(b) and 3(c), an important aspect of the invention is the fabrication of the linearly graded P region (220 and 320, respectively), which is not electrically connected to either the N+ anode (230 and 330, respectively) or the N+ cathode substrate (210 and 310, respectively). The linearly graded P-region 220 and 320, respectively) can range from 1E16/cm3 to 1E18/cm3 doping and width varies from 1 to 4 um.

The P+ sidewall/field implant (240 and 340, respectively) along the surface edge of the N+ cathode substrate (210 and 310, respectively), provides for current injection, as will be discussed hereinafter. A typical sidewall/field implant concentration varies in the range from 1E17/cm3 to 1E19/cm3.

Figure 4A:
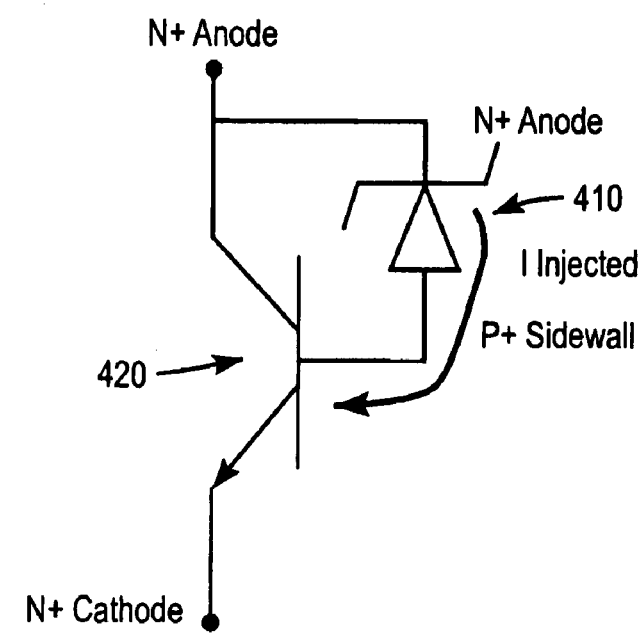
FIGS. 4(a) and 4(b) illustrate an equivalent circuit and I-V curve for the embodiment of the ESD device of FIGS. 2 and 3.
Figure 4B:
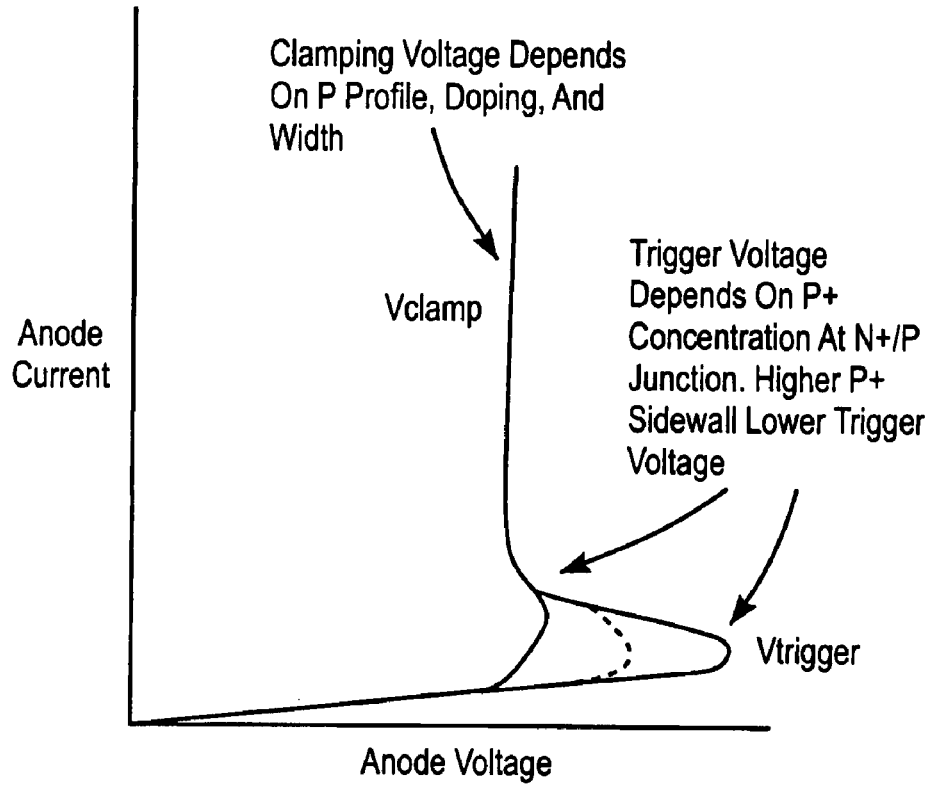

FIGS. 4(a) and 4(b) illustrate an equivalent circuit and I-V curve for the embodiment of the ESD devices 200 and 300 of FIGS. 2 and 3 respectively, with the anode, cathode and sidewall elements being labeled in words for the structures of both FIGS. 2 and 3 thereon, and is used for explaining operation of these ESD devices, which essentially is a zener diode 410 that provides injected current to the base of a bipolar junction transistor 420, such that the injected current from the zener diode 410 quickly turns on (typically on the order of around 10 nanoseconds) the bipolar junction transistor 420 and allows current to thereby flow from the anode to the cathode. When the voltage on the N+ anode (230/330 in FIGS. 2(a) and 3(a) respectively) is positive and exceeds Vtrigger, the region formed at the interface of the N+ anode (230/330 in FIGS. 2(a) and 3(a) respectively) and the P+ sidewall/field region (240/340 in FIGS. 2(a) and 3(a) respectively) begins to inject current (I injected) into the P region (not shown) by either tunneling or avalanche breakdown. This I injected current acts as a current source for the N+/P/N+ device. When this injected current is sufficiently high, the device (200/300 in FIGS. 2(a) and 3(a) respectively) switches on, providing a low impedance path for a positive voltage ESD event from the N+ anode (230/330 in FIGS. 2(a) and 3(a) respectively) to the N+ cathode (210/310 in FIGS. 2(a) and 3(a) respectively). Once the device (200/300 in FIGS. 2(a) and 3(a) respectively) is turned on, the current through the device abruptly increases and the voltage across the device reduces to Vclamp thereby placing the device in a negative resistance region of operation.

What constitutes "sufficiently high" injected current will depend on various factors of the ESD event as well as the doping profiles, but the most significant aspect with respect to this is that varying the concentration of the P+ sidewall/field implant (240/340 in FIGS. 2(a) and 3(a) respectively) at the N+ anode (230/330 in FIGS. 2(a) and 3(a) respectively) controls the V+ trigger voltage of this device (200/300 in FIGS. 2(a) and 3(a) respectively). Further, the clamping voltage of the device (200/300 in FIGS. 2(a) and 3(a) respectively) will depend upon the profile, doping and width of the P region. These aspects are illustrated in the I-V curve presented in FIG. 4(b).

The process for fabricating the device 200 is generally described by the following steps. Conventional microelectronics processing methods are used to describe the fabrication process and are sufficient to allow for an understanding of further details for anyone skilled in the arts. These steps are:

1) Start with N+ substrate (N+ cathode) 210 and deposit an Epi (P-type) layer 220.
2) Form the linearly graded doping in the P-type region 220 by either implantation, diffusion or during P-Epi growth.
3) Form the N+ anode 230 in specific areas by either implantation or diffusion.
4) Form the P+ sidewall 240 along the N+ anode 230 in specific areas by either implantation or diffusion.
5) Electrically contact the N+ anode 230 and the N+ cathode 210.

The process for fabricating the device 300 is generally described by the following steps. Conventional microelectronics processing methods are used to describe the fabrication process and are sufficient to allow for an understanding of further details for anyone skilled in the arts. These steps are:

1) Start with N+ substrate (N+ Cathode) 310 and deposit Epi (P-type) layer 320.
2) Form the linearly graded doping in the P-type region 320 by either implantation, diffusion or during P-Epi growth.
3) Form the P+ sidewall field implant 340.
4) Grow field oxide 350 on the non N+ anode region.
5) Form the N+ anode 340 by either implantation or diffusion.

Figure 5A:
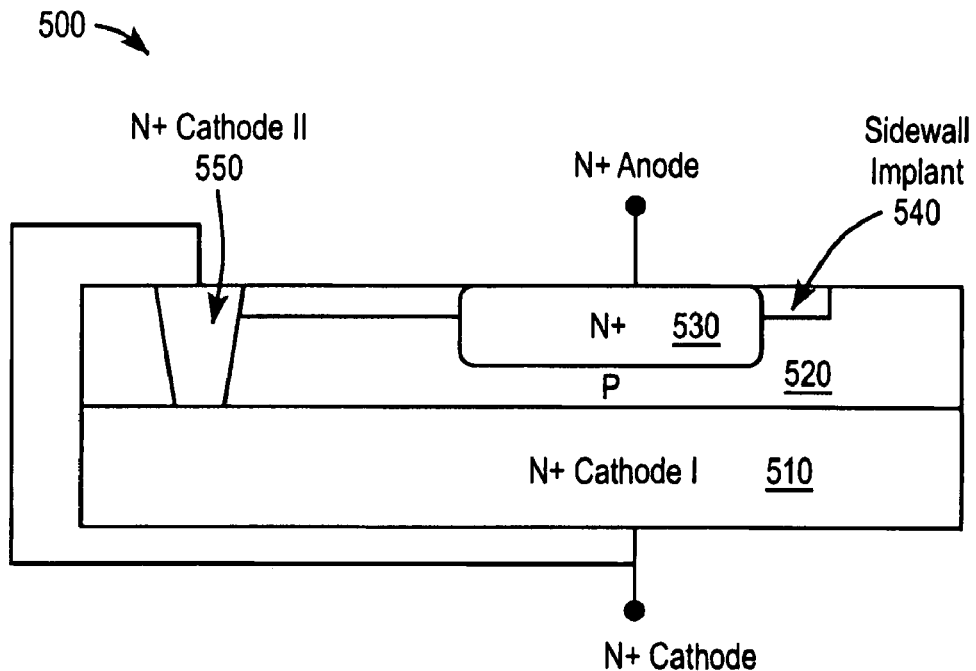
FIGS. 5(a)-5(c) illustrate another embodiment of an ESD device according to the present invention.
Figure 5B:
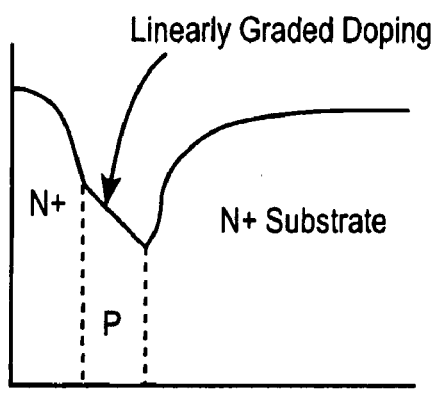
Figure 5C:
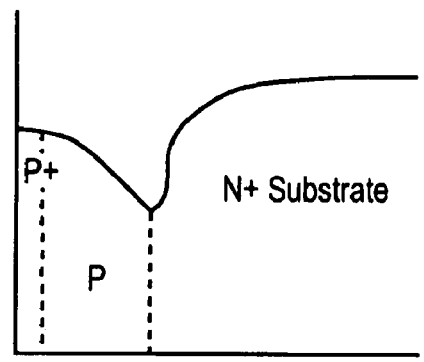

FIGS. 5(a)-5(c) illustrate another embodiment of an ESD device according to the present invention.

FIG. 5(a) illustrates ESD protection device 500 that has an N+ cathode substrate 510, a P region 520, an N+ anode region 530, and a P+ sidewall implant 540, which sidewall implant extends in one direction so that it connects to an N+ second cathode region 550 that effectively connects the P+ sidewall implant to the N+ cathode 530. The doping profile along lines a-a is illustrated in FIG. 5(b) and the doping profile along lines b-b is illustrated in FIG. 5(c).

With respect to each of FIGS. 5(b) and 5(c), an important aspect of this embodiment is also the fabrication of the linearly graded P region 520, which is not electrically connected to either the N+ anode 530 or the N+ cathode substrate 510. The linearly graded P-region 520 can range from 1E16/cm3 to 1E18/cm3 doping and width varies from 1 to 4 um.

Figure 6A:
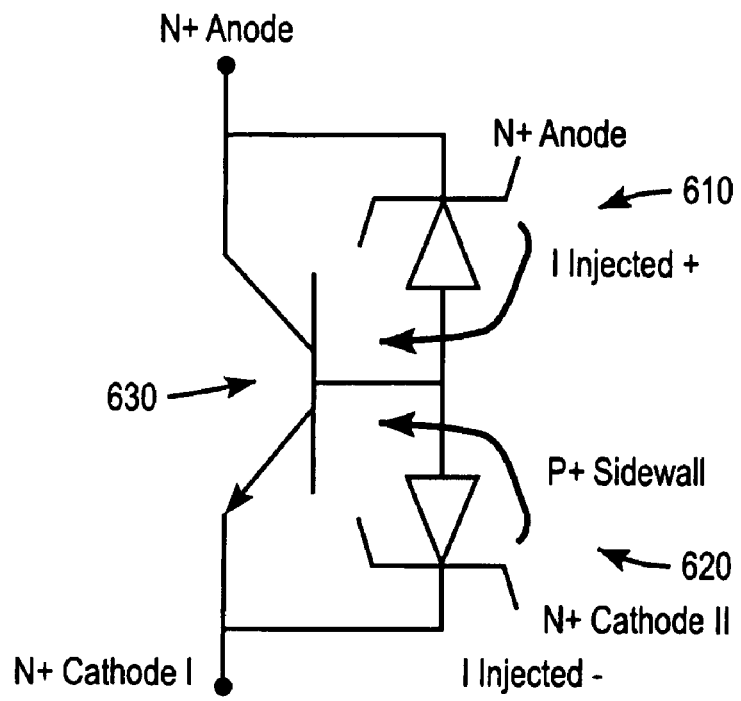
FIGS. 6(a) and 6(b) illustrate an equivalent circuit and I-V curve for the embodiment of the ESD device of FIG. 5.
Figure 6B:
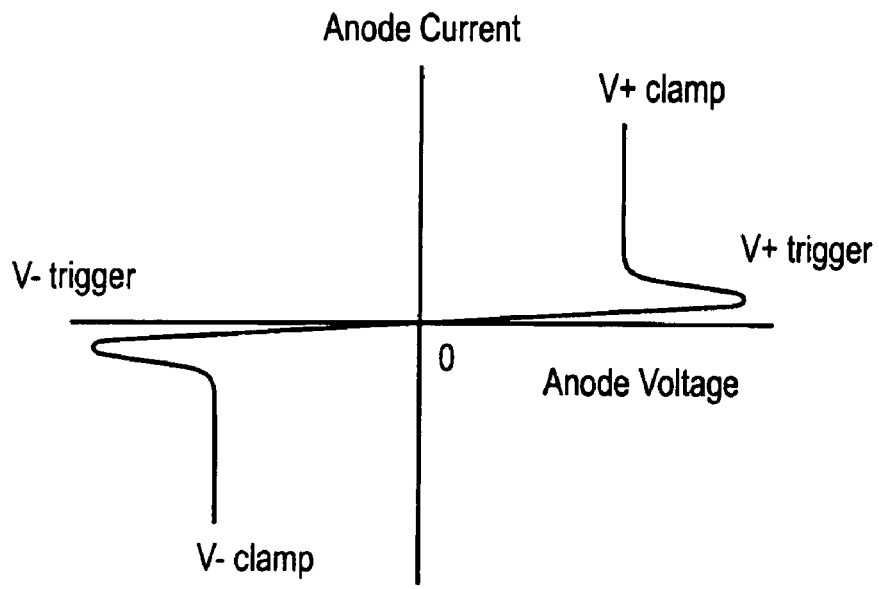

FIGS. 6(a) and 6(b) illustrate an equivalent circuit and I-V curve for the embodiment of the ESD device 500 of FIG. 5, with the anode, cathode and sidewall elements being labeled in words, and is used for explaining operation of these ESD device, which essentially is two zener diodes 610 and 620 that provides injected current to the base of a bipolar junction transistor 630, depending on whether the ESD event is a negative or positive discharge event, such that the injected current from one of the zener diodes 610, 620 quickly turns on (typically less than 10 nanoseconds) the bipolar junction transistor 630 and allows current to thereby flow from the anode to the cathode.

In this embodiment, the N+ second cathode region (550 in FIG. 5(a) labeled as N+ Cathode II in FIG. 6(a)) provides zener device 620 for low negative voltage ESD event.

Referring to FIG. 5(a) the P+ sidewall 540 along the surface edge of the N+ cathode substrate 510 provides for current injection on positive ESD events, and provides for current injection and a path to the N+ second cathode region 550 for current dissipation for negative ESD events. A typical sidewall concentration varies in the range from 1E17/cm3 to 1E19/cm3. Varying the concentration of the P+ sidewall 540 along with the concentrations of the P and N+ regions 520 and 530, respectively, assist in controlling the V+ trigger of this device. For negative voltages, the V− trigger voltage of the device is controlled by the concentrations of the sidewall region 540, and P region 520, and second cathode region 550, respectively. The doping concentrations can be adjusted by using conventional implant and/or diffusion methods.

When the voltage on the N+ anode 530 is positive and greater than V+ trigger, the region formed at the interface of the N+ anode 530 and the P+ sidewall 540 begins to inject current (I injected) into the P region 520 by either tunneling or avalanche breakdown. This I injected current acts as a current source. When this injected current is sufficiently high, the device 500 switches on, providing a low impedance path for a positive voltage ESD event from the N+ anode 530 to the N+ cathode 510. Once the device 500 is turned on, the current through the device abruptly increases and the voltage across the device reduces to V+ clamp thereby placing the device in a negative resistance region of operation.

What constitutes "sufficiently high" injected current will depend on various factors of the ESD event as well as the doping profiles, but the most significant aspect with respect to this is that varying the concentration of the P+ sidewall 540, the N+ anode 530, and the P region 520 will control the V+ trigger voltage of this device 500. Further, the clamping voltage of the device 500 will depend upon the profile, doping and width of the P region 520, which ranges were mentioned previously. These aspects are illustrated in the I-V curve presented in FIG. 6(b).

When the voltage on the N+ anode 530 is negative and less than V-trigger, the N+ second cathode region 550 and the P+ sidewall region 540 begin to inject current (I injected−) into the P region 520. When this current is sufficient enough, it can switch on this device 500. Device 500 thus provides a low impedance path for a negative voltage ESD event from the N+ anode 530 to the N+ cathode 510. Once the device 500 is turned on, the current through the device abruptly increases and the voltage across the device reduces to V-clamp thereby placing the device in a negative resistance region of operation.

This device 500 provides ESD protection for both the positive and the negative discharges with low capacitance, low leakage, and breakdown at low voltages (1.0 to 5.0 Volts)

The process for fabricating the device 500 is generally described by the following steps. Conventional microelectronics processing methods are used to describe the fabrication process and are sufficient to allow for an understanding of further details for anyone skilled in the arts. These steps are:

1) Start with N+ substrate (N+ cathode I) 510 and deposit Epi (P-type) layer 520.

2) Form the N+ second cathode region 550 in selective regions.

3) Form the linearly graded doping in the P-region 520 by either implantation, diffusion or during P-Epi growth.

4) Form the N+ anode 530 in specific areas by either implantation or diffusion.

5) Form the P+ sidewall 540 along the N+ anode 530 in specific areas by either implantation or diffusion.

6) A 2nd P+ sidewall doping along the N+ second cathode region 550 can be used, if desired, to optimize the V−Trigger.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed:

1. An apparatus that discharges an electrostatic charge, the apparatus comprising:
    a semiconductor integrated circuit, the semiconductor integrated circuit including:
        an input;
        a ground connection that provides a discharge path for the electrostatic charge; and
        an electrostatic discharge device connected between the input and the ground connection that has low leakage at an operating voltage, a positive trigger voltage, a positive clamping voltage, and wherein the positive clamping voltage is substantially independent of the positive trigger voltage, such that the device turns on in order to dissipate the electrostatic charge, the device including:
            an N+ substrate region that is connected to the ground connection,
            a P epitaxial region that is formed over the N+ anode region that has a thickness and a doping concentration that together substantially determine the positive clamping voltage, and
            an N+ electrode region that is formed within the P epitaxial region, such that a side wall surface of the N+ electrode region around a side wall surface of the P epitaxial region, the N+ electrode region connected to the input; and
            a P+ sidewall region formed over the P epitaxial region in a continuous region adjacent the sidewall surface of the N+ electrode region, wherein the P+ sidewall region and the N+ electrode form a zener diode that injects current into the P epitaxial region and thereby causes turn-on of a transistor formed by the N+ electrode region, the P region and the N+ substrate region, wherein a concentration of the P+ sidewall region assists in determining the positive trigger voltage without substantially having an effect on the positive clamping voltage.

2. The apparatus according to claim 1 wherein the P− region is linearly graded.

3. The apparatus according to claim 2 wherein a doping of the linearly graded P-region ranges from 1E16/cm3 to 1E18/cm3.

4. The apparatus according to claim 3 wherein a width of the linearly graded P-region ranges from 1 to 4 um.

5. The apparatus according to claim 1 further including a thermal oxide disposed over the P+ sidewall region.

6. The apparatus according to claim 1 wherein the positive trigger voltage is less than about 5 volts.

7. The apparatus according to claim 6 wherein the positive trigger voltage lasts for less than about 10 nanoseconds.

8. The apparatus according to claim 1 wherein the low leakage is less than about 100 NanoAmps.

9. The apparatus according to claim 8 wherein the operative voltage is less than about 5 volts.

10. An apparatus that discharges an electrostatic charge, the apparatus comprising:
    a semiconductor integrated circuit, the semiconductor integrated circuit including:
        an input;
        a ground connection that provides a discharge path for the electrostatic charge;
        an electrostatic discharge device connected between the input and the ground connection that has low leakage at an operating voltage, a positive trigger voltage, a negative trigger voltage, a positive clamping voltage, and a negative clamping voltage, and wherein the positive and the negative clamping voltages are substantially independent of the positive and the negative trigger voltages, such that the device turns on in order to dissipate the electrostatic charge, the device including:
            an N+ substrate region that is connected to the ground connection,
            a P epitaxial region that is formed over the N+ anode region that has a thickness and a doping concentration that together substantially determine the positive and negative clamping voltages, and
            an N+ electrode region that is formed within the P epitaxial region, such that a side wall surface of the N+ cathode region around a side wall surface of the P epitaxial region, the N+ electrode region connected to the input;
        a P+ sidewall region formed over the P epitaxial region in a continuous region between a portion of the sidewall surface of the N+ substrate region and a portion of the sidewall surface of the N+ electrode region; and
        an N+ region that extends between the P+ sidewall region and the N+ substrate region;
        wherein the P+ sidewall region and the N+ cathode form a positive zener diode that injects positive current into the P epitaxial region and thereby causes turn-on of a transistor formed by the N+ electrode region, the P epitaxial region and the N+ substrate region,
        wherein the P+ sidewall region and the N+ region form a negative zener diode that injects negative current into the P epitaxial region and thereby causes turn-on of a transistor formed by the N+ electrode region, the P epitaxial region and the N+ substrate region, and
        wherein a P+ concentration of the P+ sidewall region assists in determining the positive and the negative trigger voltages without substantially having an effect on the positive and the negative clamping voltages.

11. The apparatus according to claim 10 wherein the P-region is linearly graded.

12. The apparatus according to claim 11 wherein a doping of the linearly graded P-region ranges from 1E16/cm3 to 1E18/cm3.

13. The apparatus according to claim 12 wherein a width of the linearly graded P-region ranges from 1 to 4 um.

14. The apparatus according to claim 1 wherein the positive trigger voltage is less than about 5 volts and the negative trigger voltage is greater than about −5 volts.

15. The apparatus according to claim 14 wherein the positive trigger voltage lasts for less than about 10 nanoseconds and the negative trigger voltage lasts for less than about 10 nanoseconds.

16. The apparatus according to claim 10 wherein the low leakage is less than about 100 NanoAmps.

17. The apparatus according to claim 16 wherein the operative voltage is less than about 5 volts.

* * * * *